US012684805B2

(12) United States Patent
Pandey et al.

(10) Patent No.: US 12,684,805 B2
(45) Date of Patent: Jul. 14, 2026

(54) HIGH PERFORMANCE LATERALLY-DIFFUSED METAL-OXIDE SEMICONDUCTOR STRUCTURE

(71) Applicant: GLOBALFOUNDRIES U.S. Inc., Malta, NY (US)

(72) Inventors: Shesh Mani Pandey, Saratoga Springs, NY (US); Rajendran Krishnasamy, Essex Junction, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 629 days.

(21) Appl. No.: 17/872,360

(22) Filed: Jul. 25, 2022

(65) Prior Publication Data

US 2024/0030341 A1      Jan. 25, 2024

(51) Int. Cl.
*H10D 30/65* (2025.01)
*H10D 30/01* (2025.01)
(Continued)

(52) U.S. Cl.
CPC ....... *H10D 30/658* (2025.01); *H10D 30/0289* (2025.01); *H10D 62/116* (2025.01); *H10D 62/393* (2025.01)

(58) Field of Classification Search
CPC .. H10D 30/65; H10D 30/658; H10D 30/0289; H10D 30/603; H10D 30/0221; H10D 30/608; H10D 62/113; H10D 62/116; H10D 62/123; H10D 62/152; H10D 62/153; H10D 62/154; H10D 62/156; H10D 62/157; H10D 62/158; H10D 62/393; H10D 62/83; H10D 64/512; H10D 64/513; H10D 64/517; H10D 64/518; H10D 64/117; H10D 64/251; H10D 64/257; H10D 64/258; H10D 64/665; H10D 64/669; H10D 64/68–693; H10D 30/0411–0415; H10D 30/69–699; H01L 29/808; H01L 29/0692; (Continued)

(56) References Cited

U.S. PATENT DOCUMENTS 5,930,633 A    7/1999  Liaw
6,124,611 A    9/2000  Mori
(Continued)

FOREIGN PATENT DOCUMENTS

CN        112909095        6/2021
KR      2011079021 A  *  7/2011  ......... H01L 21/2253

OTHER PUBLICATIONS

Ko, Semiconductor device and method for manufacturing the same, 2011, machine translation of KR 2011-0079021A, pp. 1-4 (Year : 2011).*

(Continued)

*Primary Examiner* — Natalia A Gondarenko
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to laterally-diffused metal-oxide semiconductors and methods of manufacture. The structure includes: a drift region within a semiconductor substrate; a shallow trench isolation structure extending within the drift region; and a gate structure over the semiconductor substrate and extending within the shallow trench isolation structure.

19 Claims, 6 Drawing Sheets

(51) Int. Cl.
    *H10D 62/10*     (2025.01)
    *H10D 62/17*     (2025.01)
(58) Field of Classification Search
    CPC ............. H01L 29/1095; H01L 29/0634; H01L 29/7835; H01L 29/66901; H01L 29/7816; H01L 29/1066; H01L 29/78; H01L 29/66681; H01L 29/0615; H01L 29/0661; H01L 29/0623; H01L 29/0865; H01L 29/0886; H01L 29/41725; H01L 29/4238; H01L 29/0834; H01L 29/73; H01L 29/8086; H01L 29/7811; H01L 29/0619; H01L 29/0649; H01L 29/0653; H01L 29/0696; H01L 29/7832; H01L 29/0847; H01L 29/66659; H01L 29/7838; H01L 29/0843; H01L 29/0882; H01L 29/1083; H01L 29/41758; H01L 29/42316; H01L 29/6606; H01L 29/66893; H01L 29/66568; H01L 29/66674; H01L 29/70; H01L 29/7424; H01L 29/7801; H01L 29/7809; H01L 29/80; H01L 21/02142–02161; H01L 21/0214; H01L 21/0217; H01L 21/02321–02332; H01L 21/02197; H01L 21/022; H01L 21/02304; H01L 21/02362; H01L 21/02175–02194; H01L 21/28158–28238; H01L 21/3143–3145; H01L 21/3142
    USPC ....... 257/244, 339, 335, 336, 343, 369, 408, 257/409, 481, 104, 493, 548
    See application file for complete search history.

(56) References Cited

U.S. PATENT DOCUMENTS

| | | | |
|---|---|---|---|
| 7,851,857 B2 | 12/2010 | Fu | |
| 7,888,732 B2 | 2/2011 | Denison | |
| 8,004,039 B2 | 8/2011 | Zinn | |
| 8,174,071 B2 | 5/2012 | Tien et al. | |
| 8,643,090 B2 | 2/2014 | Shrivastava | |
| 8,716,791 B1 | 5/2014 | Iravani et al. | |
| 8,766,358 B2 | 7/2014 | Lee | |
| 8,896,057 B1 | 11/2014 | Yu | |
| 8,987,813 B2 | 3/2015 | Lee | |
| 9,306,034 B2 | 4/2016 | Tu | |
| 9,391,196 B1 | 7/2016 | Chang et al. | |
| 9,443,958 B2 | 9/2016 | Hsu | |
| 9,590,053 B2 | 3/2017 | Chou et al. | |
| 9,825,147 B2 | 11/2017 | Hsu | |
| 9,842,903 B2 | 12/2017 | Lu et al. | |
| 9,853,021 B1* | 12/2017 | Wang ................... | H10D 30/603 |
| 9,859,416 B2 | 1/2018 | Mori et al. | |
| 9,871,132 B1 | 1/2018 | Liu et al. | |
| 10,008,573 B1 | 6/2018 | Hsiao | |
| 10,164,006 B1 | 12/2018 | Ciavatti | |
| 10,680,100 B2 | 6/2020 | Su | |
| 10,825,905 B2 | 11/2020 | Kuo | |
| 10,910,478 B1 | 2/2021 | Xu | |
| 10,971,624 B2 | 4/2021 | Wang | |
| 11,411,086 B2 | 8/2022 | Chen | |
| 11,515,416 B2 | 11/2022 | Mehrotra | |
| 11,652,168 B2 | 5/2023 | Lin | |
| 11,916,115 B2 | 2/2024 | Ho | |
| 11,929,432 B2 | 3/2024 | Uda | |
| 12,230,693 B2 | 2/2025 | He | |
| 2006/0261378 A1 | 11/2006 | Moscatelli | |

| | | | |
|---|---|---|---|
| 2009/0140343 A1* | 6/2009 | Feilchenfeld ...... | H10D 30/0289 |
| | | | 257/E29.256 |
| 2009/0166736 A1 | 7/2009 | Park | |
| 2009/0256212 A1 | 10/2009 | Denison | |
| 2009/0273026 A1 | 11/2009 | Wilson et al. | |
| 2009/0273029 A1 | 11/2009 | Tien et al. | |
| 2009/0283825 A1 | 11/2009 | Wang | |
| 2010/0237412 A1 | 9/2010 | Shrivastava | |
| 2011/0169076 A1 | 7/2011 | Chang | |
| 2012/0094457 A1 | 4/2012 | Gabrys | |
| 2012/0248528 A1 | 10/2012 | Wilson et al. | |
| 2013/0240996 A1* | 9/2013 | Yin ..................... | H10D 84/038 |
| | | | 257/E27.06 |
| 2013/0277741 A1 | 10/2013 | Guowei | |
| 2013/0277742 A1 | 10/2013 | Lee | |
| 2014/0042527 A1 | 2/2014 | Lee et al. | |
| 2014/0061791 A1 | 3/2014 | Yu et al. | |
| 2014/0320174 A1 | 10/2014 | Lu | |
| 2014/0339632 A1 | 11/2014 | Yu | |
| 2014/0367778 A1 | 12/2014 | Sharma | |
| 2015/0014768 A1 | 1/2015 | Chen | |
| 2015/0243777 A1 | 8/2015 | Fujii | |
| 2015/0340448 A1 | 11/2015 | Babcock | |
| 2015/0349050 A1* | 12/2015 | Fang .................... | H10D 30/603 |
| | | | 438/270 |
| 2016/0099340 A1 | 4/2016 | Hsu | |
| 2016/0111488 A1 | 4/2016 | Lu | |
| 2016/0149007 A1 | 5/2016 | Chou | |
| 2016/0211348 A1 | 7/2016 | Yoshida | |
| 2016/0240663 A1 | 8/2016 | Tu et al. | |
| 2016/0336410 A1 | 11/2016 | Hsiao | |
| 2017/0025532 A1 | 1/2017 | Mori | |
| 2017/0104097 A1 | 4/2017 | Park | |
| 2017/0243977 A1* | 8/2017 | Lin ..................... | H10D 64/518 |
| 2017/0278963 A1 | 9/2017 | Liu | |
| 2017/0352731 A1 | 12/2017 | Kuo | |
| 2018/0175192 A1* | 6/2018 | Fujii ................... | H10D 62/109 |
| 2019/0088777 A1 | 3/2019 | Lu | |
| 2019/0097044 A1 | 3/2019 | Lee | |
| 2019/0305129 A1 | 10/2019 | Uda | |
| 2020/0013888 A1 | 1/2020 | Su | |
| 2020/0395452 A1 | 12/2020 | Wang | |
| 2021/0028299 A1 | 1/2021 | Liu | |
| 2021/0036112 A1 | 2/2021 | Xu | |
| 2021/0074851 A1 | 3/2021 | Chiu | |
| 2021/0234041 A1 | 7/2021 | Jin | |
| 2021/0296451 A1 | 9/2021 | Chen | |
| 2021/0367064 A1 | 11/2021 | Liu | |
| 2022/0093793 A1 | 3/2022 | Mehrotra | |
| 2022/0285551 A1* | 9/2022 | Yang .................. | H10D 30/0281 |
| 2022/0328684 A1 | 10/2022 | Lin | |
| 2023/0223437 A1 | 7/2023 | Tailor | |
| 2023/0420464 A1 | 12/2023 | Yu | |
| 2024/0097051 A1 | 3/2024 | Li | |
| 2024/0395929 A1 | 11/2024 | Lin et al. | |

OTHER PUBLICATIONS

European Search Report and Opinion dated Mar. 5, 2024 in EP Application No. 2319686.0-1212, 10 pages.
Yue Hu et al., "Numerical investigation on L-shaped vertical field plate in high-voltage LDMOS", https://doi.org/10.1016/j.rinp.2019. 102547, Results in Physics, vol. 15, 2019, 102547, ISSN 2211-3797, 6 pages.
Non-Final Office Action dated Jun. 23, 2025 in U.S. Appl. No. 17/984,736, 13 pages.
Final Office Action dated Nov. 24, 2025 in U.S. Appl. No. 17/984,736, 26 pages.
Notice of Allowance and Fees dated Mar. 13, 2026 in U.S. Appl. No. 18/111,995, 20 pages.

* cited by examiner

HIGH PERFORMANCE LATERALLY-DIFFUSED METAL-OXIDE SEMICONDUCTOR STRUCTURE

BACKGROUND

The present disclosure relates to semiconductor structures and, more particularly, to laterally-diffused metal-oxide semiconductors and methods of manufacture.

A laterally-diffused metal-oxide semiconductor (LD-MOS) is a planar double-diffused MOSFET (metal-oxide-semiconductor field-effect transistor) used in amplifiers, including microwave power amplifiers, RF power amplifiers and audio power amplifiers. These transistors are often fabricated on $pip^+$ silicon epitaxial layers. The fabrication of LDMOS devices mostly involves various ion-implantation and subsequent annealing cycles. As an example, the drift region of a power MOSFET is fabricated using up to three ion implantation sequences in order to achieve the appropriate doping profile needed to withstand high electric fields.

The silicon-based RF LDMOS (radio-frequency LDMOS) is a widely used RF power amplifier in mobile networks, enabling the majority of the world's cellular voice and data traffic. LDMOS devices are widely used in RF power amplifiers for base-stations as the requirement is for high output power with a corresponding drain to source breakdown voltage usually above 60 volts. Compared to other devices such as GaAs FETs, RF LDMOS show a lower maximum power gain frequency.

SUMMARY

In an aspect of the disclosure, a structure comprises: a drift region within a semiconductor substrate; a shallow trench isolation structure extending within the drift region; and a gate structure over the semiconductor substrate and extending within the shallow trench isolation structure.

In an aspect of the disclosure, a structure comprises: a shallow trench isolation structure extending into a semiconductor substrate; and a gate structure comprising a gate dielectric material and a gate electrode, the gate dielectric material and the gate electrode being over the semiconductor substrate and extending within the shallow trench isolation structure.

In an aspect of the disclosure, a method comprises: forming a drift region within a semiconductor substrate; forming a shallow trench isolation structure extending within the drift region; and forming a gate structure over the semiconductor substrate and extending within the shallow trench isolation structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to laterally-diffused metal-oxide semiconductor structures and methods of manufacture. More specifically, the present disclosure relates to high performance laterally-diffused metal-oxide semiconductors with a gate recessed within a shallow trench isolation structure. Advantageously, the gate recessed within the shallow trench isolation structure provides increased device performance.

In more specific embodiments, the laterally-diffused metal-oxide semiconductors (LDMOS) include a trench within a well (e.g., drift region) of a semiconductor substrate. The trench may be a shallow trench isolation structure. A gate structure may be provided on the semiconductor substrate which extends within the trench. In embodiments, the remaining portion of the trench may be filled with dielectric material, e.g., $SiO_2$, which forms the shallow trench isolation structure. In this way, the gate structure is recessed within a shallow trench isolation structure. In embodiments, the gate dielectric material, e.g., high-k material, and the gate conductor may both be provided within the shallow trench isolation structure, with the insulator material of the shallow trench isolation structure, e.g., $SiO_2$, acting as spacers to the gate structure. The gate structure may, e.g., include one or two tapered sides, be asymmetrically or symmetrically positioned within the trench, include one or more gate dielectric layers and/or have a gate dielectric thicker on one sidewall than an opposing sidewall.

The LDMOS of the present disclosure can be manufactured in a number of ways using a number of different tools. In general, though, the methodologies and tools are used to form structures with dimensions in the micrometer and nanometer scale. The methodologies, i.e., technologies, employed to manufacture the LDMOS of the present disclosure have been adopted from integrated circuit (IC) technology. For example, the structures are built on wafers and are realized in films of material patterned by photolithographic processes on the top of a wafer. In particular, the fabrication of the LDMOS uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
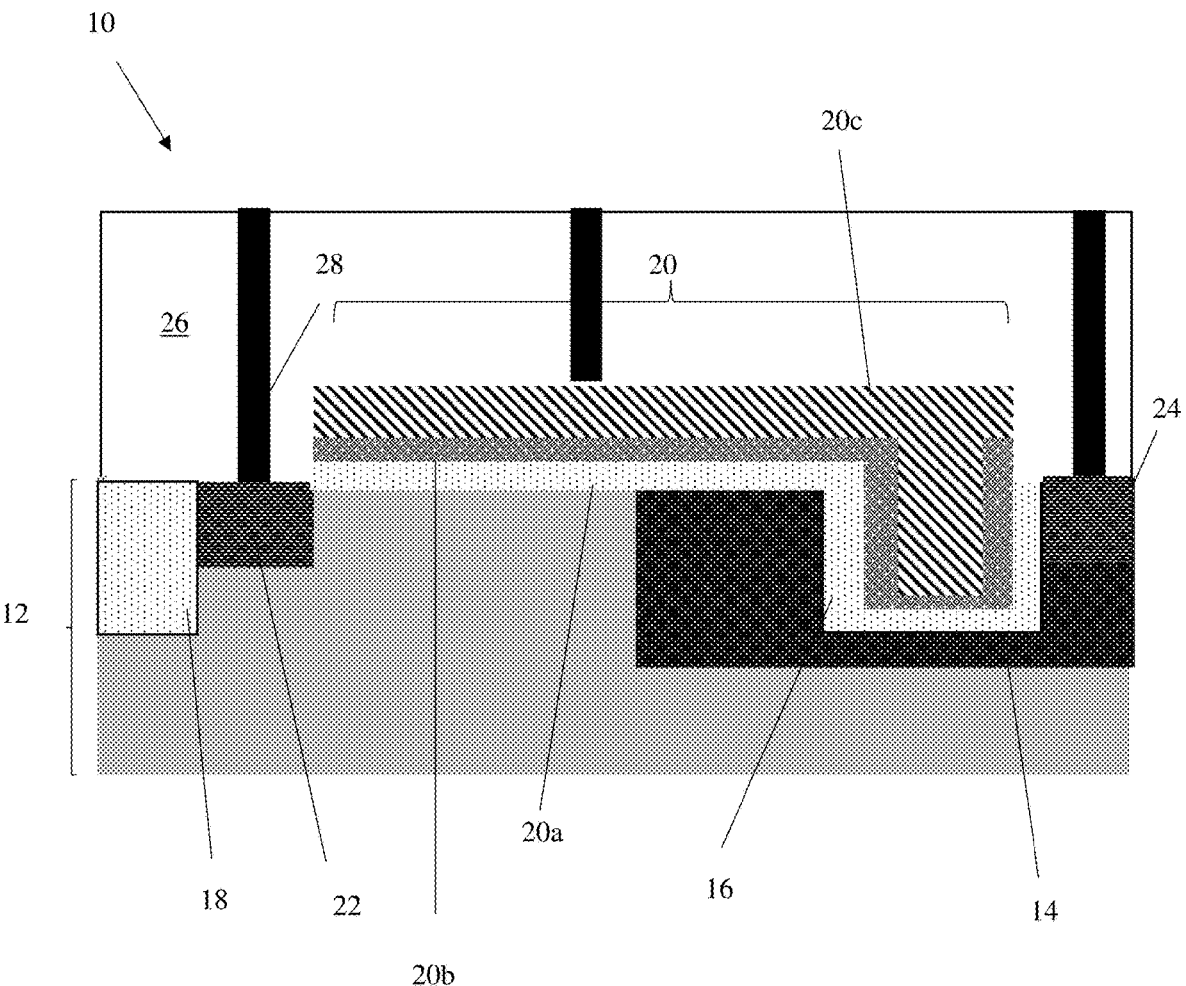
FIG. 1 shows an LDMOS structure and respective fabrication processes in accordance with aspects of the present disclosure.

FIG. 1 shows an LDMOS structure and respective fabrication processes in accordance with aspects of the present disclosure. More specifically, the LDMOS structure 10 includes a semiconductor substrate 12 composed of any suitable material including, but not limited to, Si, SiGe, SiGeC, SiC, GaAs, InAs, InP, and other III/V or II/VI compound semiconductors. In more specific embodiments, the semiconductor substrate 12 may be p+ doped Si material.

A well implant 14 is provided within the semiconductor substrate 12. In embodiments, the well implant 14 may be a drift region for a drain region of the device. The well implant 14 may preferably be an N-well implant region. As described in more detail with respect to FIG. 4A, the well implant 14 may be formed by a conventional ion implantation process that introduces a concentration of n-type dopant into the semiconductor substrate 12.

Still referring to FIG. 1, shallow trench isolation structures 16, 18 may be formed within the semiconductor substrate 12. As described with respect to FIG. 4A, the shallow trench isolation structures 16, 18 may be formed by conventional lithography, etching and deposition processes. In embodiments, the shallow trench isolation structures 16, 18 may comprise a trench filled with low-k dielectric material, e.g., $SiO_2$. The low-k dielectric material 20*a* may act as a sidewall to a gate structure 20 that partially extends to within the shallow trench isolation structure 16.

Figure 4A:
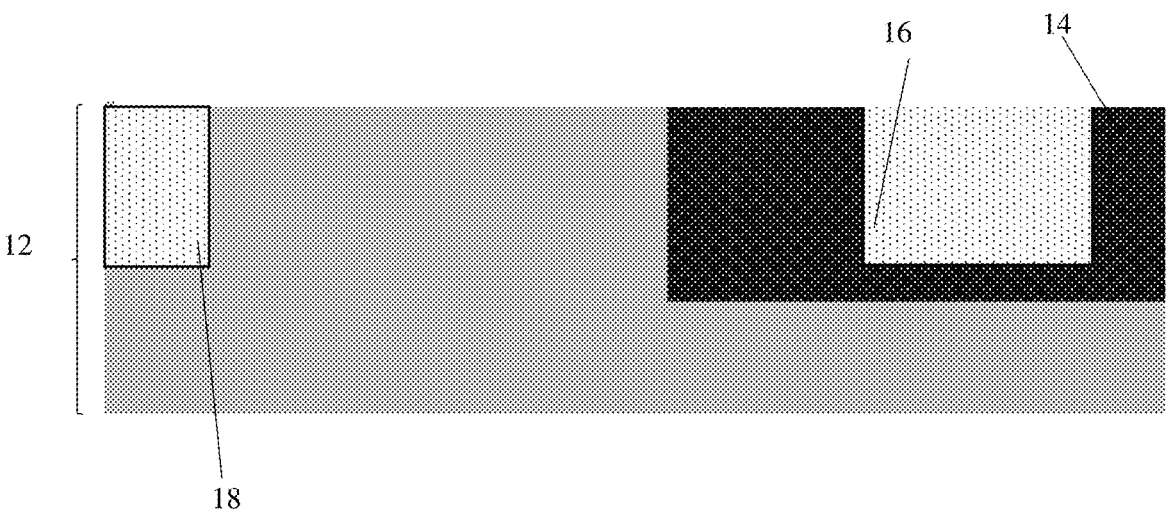
FIGS. 4A-4D show processing steps for the fabrication of the LDMOS structure shown in FIG. 1 in accordance with aspects of the present disclosure.
Figure 4B:
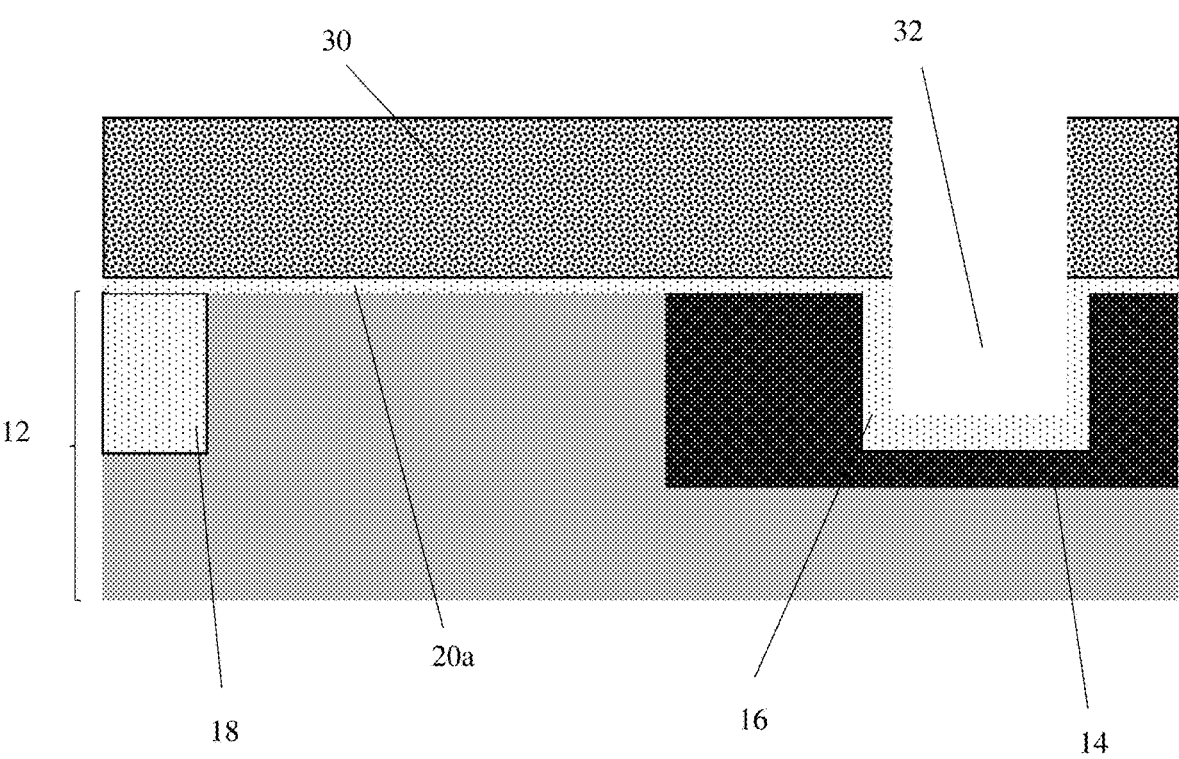
Figure 4C:
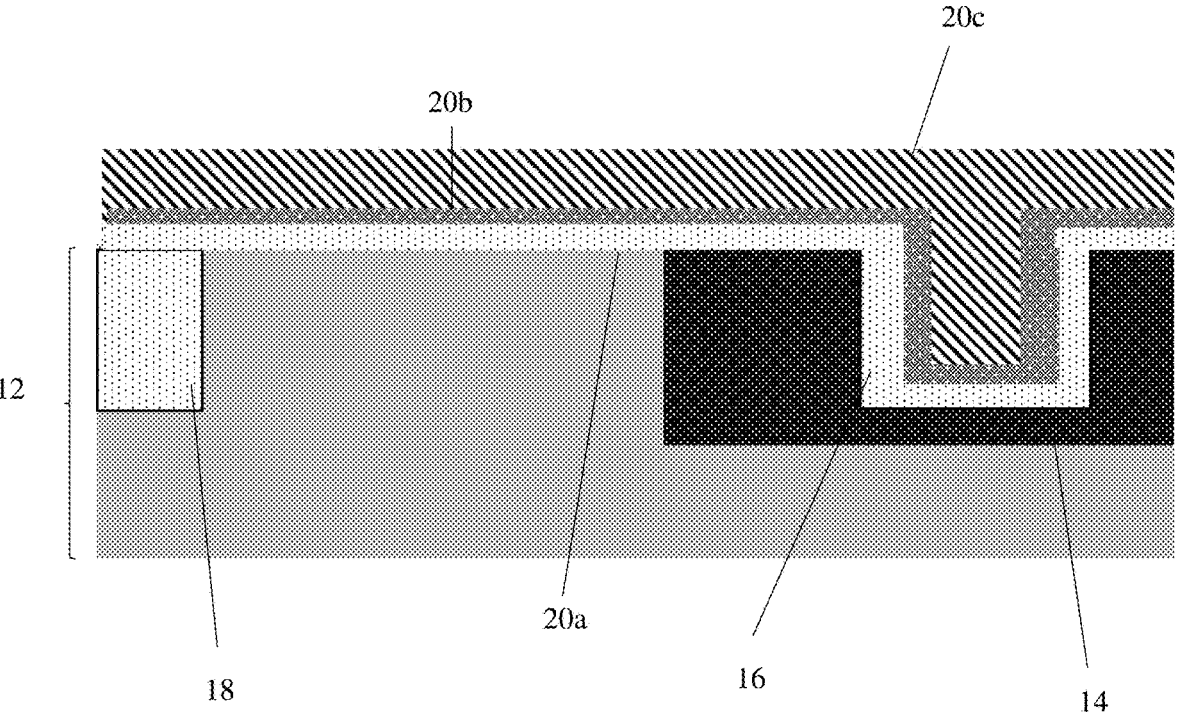
Figure 4D:
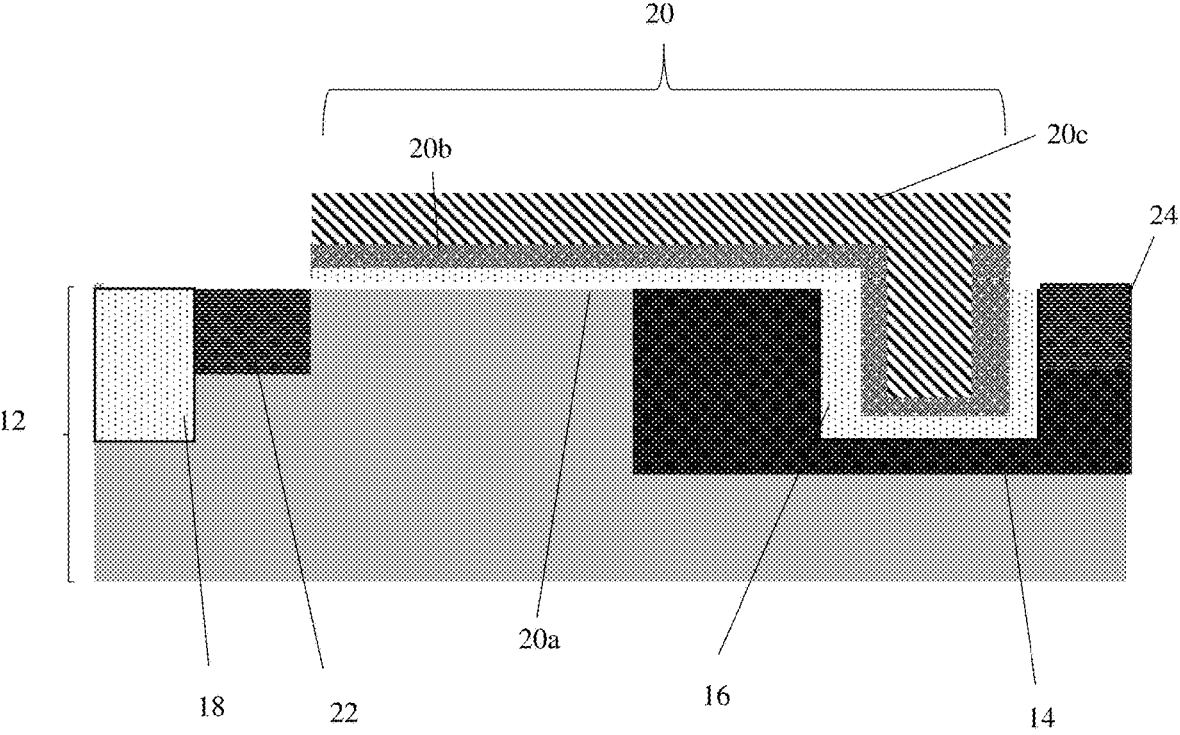

The gate structure 20 may be formed on the semiconductor substrate 12 and, more specifically, partially over and recessed within the shallow trench isolation structure 16 as described in more detail with respect to FIGS. 4B-4D. The portion of the gate structure 20 extending into the shallow trench isolation structure 16 may have a height smaller than the total height of the shallow trench isolation structure 16. The gate structure 20 may also be partially over the N-well implant region 14, e.g., drift region.

In this embodiment, the gate structure 20 may be symmetrically positioned within the shallow trench isolation structure 16; although other locations and configurations are also contemplated by the present disclosure. Moreover, in this embodiment, the gate structure 20 may have vertical sidewalls within the shallow trench isolation structure 16, with the low-k dielectric material of the shallow trench isolation structure 16, e.g., $SiO_2$, acting as sidewall spacers. The sidewalls of the gate structure 20 may be parallel to the sidewalls of the shallow trench isolation structure 16. Also, as in any of the embodiments described herein, the gate structure 20 may include one or more gate dielectric layers 20*a*, and/or have a gate dielectric thicker on one sidewall than an opposing sidewall. In embodiments, the one or more gate dielectric layers 20*a*, 20*b* are above the semiconductor substrate 12, with the gate dielectric layer 20*a* being the same material as the insulator material of the shallow trench isolation structure 16.

The gate structure 20 recessed into the shallow trench isolation structure 16 increases the surface area of the gate structure 20. Also, the portion of the gate structure within the shallow trench isolation structure 16 will have a surface in close proximity to the drift region, e.g., N-well region 14, which helps in the accumulation of charge in the drift region, e.g., N-well region 14. In this way, the device can handle higher current with a low breakdown voltage at the junction of the drift region 14 and the gate structure 20.

In embodiments, the gate structure 20 may comprise gate dielectric materials 20*a*, 20*b* and a gate electrode 20*c*. The gate dielectric material 20*a* may be a low-k dielectric material, e.g., $SiO_2$, whereas the gate dielectric material 20*b* may be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The low-k dielectric material 20*a* may also be the same material within the shallow trench isolation structures 16, 18. Accordingly, the gate dielectric material 20*a* on the semiconductor substrate 20*a* can be the same composition and same thickness as the insulator material of the shallow trench isolation structure (which acts also as sidewalls to the gate structure 20).

The gate electrode 20*c* may be metal workfunction materials or a polysilicon material. In the case of a polysilicon material, the high-k gate dielectric material 20*b* may be eliminated. Examples of workfunction materials may include Ti, TiAlC, Al, TiAl, TaN, TiN, TiC, Co, TaC, HfTi, TiSi or TaSi. The workfunction materials 20*c* and gate dielectric materials 20*a*, 20*b* may be formed by chemical vapor deposition (CVD), physical vapor deposition (PVD) including sputtering, atomic layer deposition (ALD) or other suitable method as described in more detail with respect to FIG. 4C. The gate dielectric materials 20*a* may have a thickness of about 1 nm to about 5 nm; although other dimensions are also contemplated herein.

Figure 2:
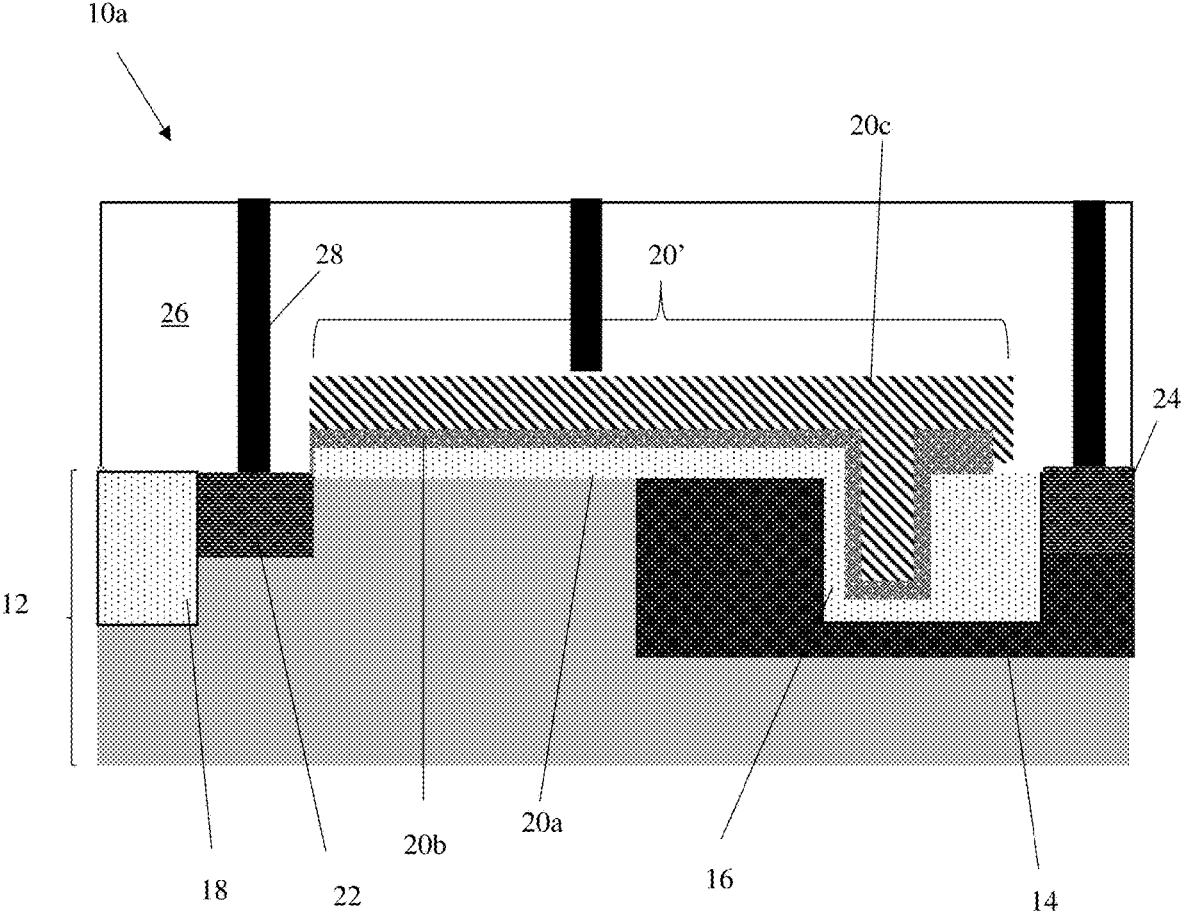
FIG. 2 shows an LDMOS structure in accordance with additional aspects of the present disclosure.

FIG. 2 shows an LDMOS structure in accordance with additional aspects of the present disclosure. More specifically, the LDMOS structure 10*a* of FIG. 2 shows a gate structure 20' asymmetrically positioned within the shallow trench isolation structure 16. In more specific embodiments, the gate structure 20' is positioned closer to one sidewall than another sidewall of the shallow trench isolation structure 16. In embodiments, the sidewalls of the gate structure 20' may either be vertical or tapered. And as with each of the different embodiments, the insulator material within the shallow trench isolation structure 16 may be used as sidewall structures of the gate structure 20. The remaining features of the structure 10*a* are similar to the structure 10 of FIG. 1 such that no further explanation is required for a complete understanding of the present disclosure.

Figure 3:
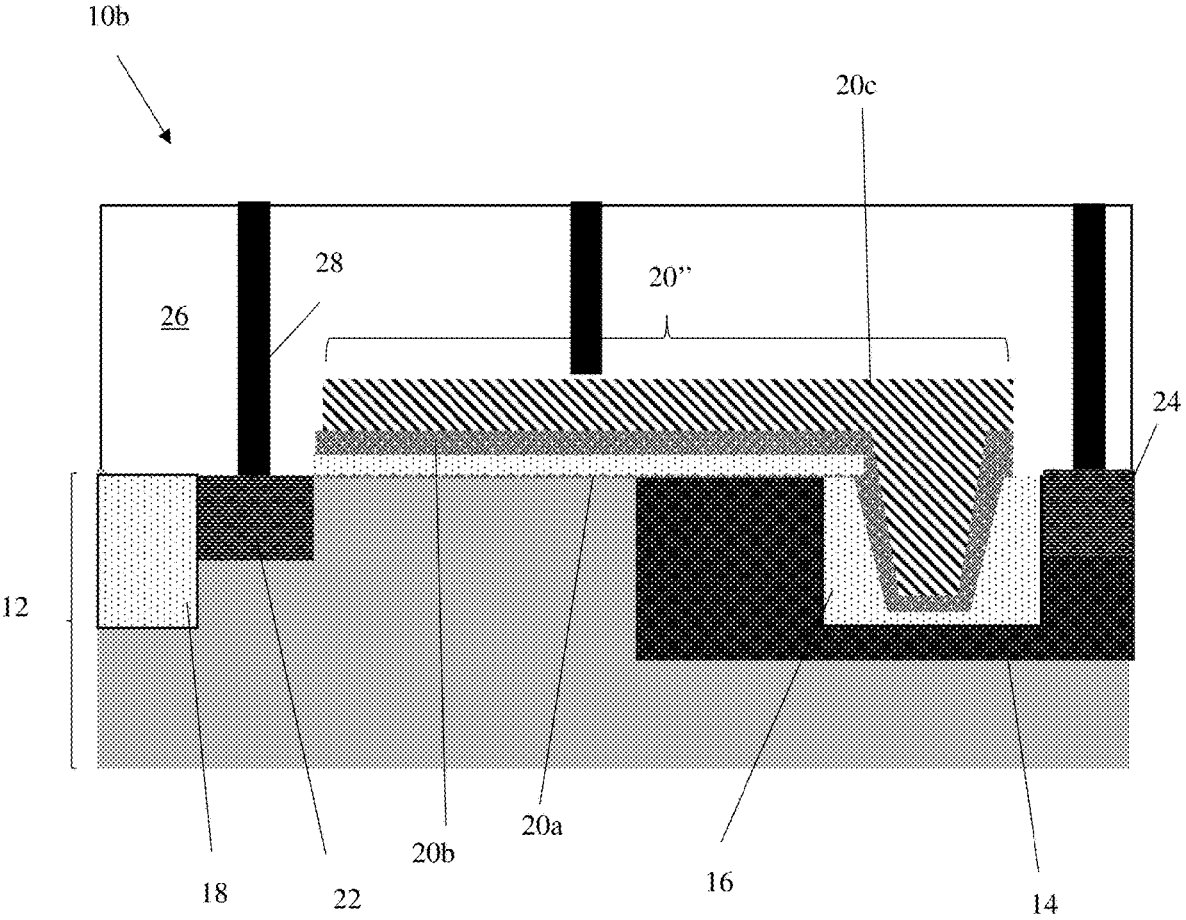
FIG. 3 shows an LDMOS structure in accordance with yet additional aspects of the present disclosure.

FIG. 3 shows an LDMOS structure in accordance with additional aspects of the present disclosure. More specifically, the LDMOS structure 10*b* of FIG. 3 shows a gate structure 20" with tapered sidewalls. It should also be understood as with any of the embodiments, the gate structure 20" may, e.g., include one or two tapered sides within the shallow trench isolation structure 16, be asymmetrically or symmetrically positioned within the shallow trench isolation structure 16, include one or more gate dielectric layers within the shallow trench isolation structure 16 and/or have a gate dielectric thicker on one sidewall than an opposing sidewall. In addition, as in each of the embodiments, the sidewalls of the shallow trench isolation structure 16 may be tapered or vertical with the gate structure having one or two tapered sides or vertical sidewalls within the shallow trench isolation structure 16 or combinations thereof. The remaining features of the structure 10*b* are similar to the structure 10 of FIG. 1 such that no further explanation is required for a complete understanding of the present disclosure.

FIGS. 4A-4D show processing steps for the fabrication of the LDMOS structure shown in FIG. 1. It should be understood by those of ordinary skill in the art that similar processes can be used to manufacture the structures shown in FIGS. 2 and 3.

In FIG. 4A, the N-well 14 may be formed within the semiconductor substrate 12 by an ion implantation process. By way of example, the N-well 14 may be formed by introducing a concentration of an N-type dopant in the semiconductor substrate 12 using a patterned implantation mask to define selected areas exposed for the implantation as is known in the art. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The N-well 14 may be doped with n-type dopants, e.g., Arsenic (As), Phosphorus (P) and Sb, among other suitable examples at different concentrations. An annealing process may be used to diffuse the dopants into the semiconductor substrate 12.

Still referring to FIG. 4A, the shallow trench isolation structures 16, 18 may be formed in the semiconductor substrate 12. As already described, the shallow trench isolation structure 16 may be formed in the N-well 14 of the semiconductor substrate 12. In embodiments, the shallow trench isolation structures 16, 18 can be formed by conventional lithography, etching and deposition methods known to those of skill in the art. For example, a resist formed over the semiconductor substrate 12 is exposed to energy (light) and developed to form a pattern (opening). An etching process with a selective chemistry, e.g., reactive ion etching (RIE), will be used to transfer the pattern from the resist layer to the semiconductor substrate 12 to form one or more trenches in the semiconductor substrate 12, including in the N-well 14. Following the resist removal by a conventional oxygen ashing process or other known stripants, insulator material (e.g., $SiO_2$) can be deposited by any conventional deposition process, e.g., CVD processes. Any residual material on the surface of the semiconductor substrate 12 can be removed by conventional chemical mechanical polishing (CMP) processes.

FIG. 4B shows formation of a trench 32 within the shallow trench isolation structure 16. Prior to forming the trench 32, the gate dielectric material 20*a* may be deposited over the semiconductor substrate 12 and the shallow trench isolation structure 16. In embodiments, the gate dielectric material 20*a* may be deposited by a conventional CVD process.

The trench 32 can be formed by a conventional lithography and etching methods known to those of skill in the art with the patterned resist 30 shown in FIG. 4B. In this fabrication step, the pattern of the resist 30 aligns with the shallow trench isolation structure 16 to form the trench 32 within the insulator material of the shallow trench isolation structure 16. Depending on the embodiment, the trench 32 may, e.g., (i) be centered within the shallow trench isolation structure 16 (e.g., symmetrical), (ii) be offset within the shallow trench isolation structure 16 (e.g., asymmetrical), (iii) have tapered sidewalls, or (iv) have vertical sidewalls. The resist 30 can be stripped following the patterning process using any known stripping method as already described herein.

In FIG. 4C, the gate dielectric material 20*b* and gate electrode material 20*c* may be deposited over the gate dielectric material 20*c* and within the trench 32. As noted herein, the gate dielectric material 20*b* may be a high-k or low-k dielectric material and the gate electrode material 20*c* may be a workfunction material or polysilicon. In the case of polysilicon, the gate dielectric material 20*c* would be a low-k dielectric material. The gate dielectric material 20*b* and gate electrode material 20*c* may be deposited by any conventional deposition method such as CVD, PVD or ALD and, in embodiments, preferably ALD.

As shown in FIG. 4D, the gate dielectric materials 20*a*, 20*b* and the gate electrode material 20*c* may be patterned to form the gate structure 20, which now extends to within the shallow trench isolation structure 16 over the N-well 14. In embodiments, the gate dielectric materials 20*a*, 20*b* and the gate electrode material 20*c* may be patterned using conventional lithography and etching processes as already described herein.

Source 22 and drain 24 regions are provided using conventional ion implantation processes with, for example, N+ type dopants. In embodiments, the drain 24 is provided within the N-well 14, e.g., drift region, which is separated from the gate structure 20 by the insulator material on the sidewall of the shallow trench isolation structure 16. The source 22 is formed within the semiconductor substrate 12, adjacent to the gate structure 20.

Referring back to FIG. 1, the dielectric material 26 may be formed over the gate structure 20. In embodiments, the dielectric material 26 may comprise a combination of nitride and/or oxide based materials, e.g., SiN and $SiO_2$, deposited using conventional deposition processes, e.g., CVD. Vias or trenches may be formed within the dielectric material 26 to expose the source 22, drain 24 and gate structure 20. The vias or trenches may be formed using conventional lithography and etching processes as described herein such that no further explanation is required for a complete understanding of the present disclosure.

The exposed surfaces of the source 22 and the drain 24 undergo a silicide process to form silicide contacts on the exposed semiconductor material of the source 22 and the drain 24. In the case of the gate structure 20 comprising polysilicon, a silicide process can also be performed through the via which exposes the gate structure 20. It should be understood by those of skill in the art that silicide contacts will not be required on a gate structure 20 which comprises workfunction metals.

As should be understood by those of skill in the art, the silicide process begins with deposition of a thin transition metal layer, e.g., nickel, cobalt or titanium, over fully formed and patterned semiconductor material. After deposition of the material, the structure is heated allowing the transition metal to react with exposed silicon (or other semiconductor material as described herein) in the active regions of the semiconductor device, e.g., the source 22 and the drain 24 and, in some embodiments, the gate structure 20 which comprises polysilicon, forming a low-resistance transition metal silicide. Following the reaction, any remaining transition metal is removed by chemical etching, leaving silicide contacts in the active regions of the device.

Contacts 28 are formed within the vias or trenches of the dielectric material 26, connecting to the source 22, the drain 24 and the gate structure 20. In more specific embodiments, the contacts 28 land on the silicide contacts of the source 22, the drain 24 and, in embodiments, the gate structure 20. The contacts may be tungsten, for example, lined with TaN or TiN. The contacts 28 may be deposited using conventional deposition process, e.g., CVD, followed by a CMP process to remove any excessive material on the surface of the dielectric material 26.

The LDMOS can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a drift region within a semiconductor substrate and which includes a trench structure;
a shallow trench isolation structure comprising a trench within insulator material, the insulator material and the trench extending within the trench structure of the drift region; and
a gate structure comprising gate dielectric materials fully extending into the trench of the shallow trench isolation structure and over the semiconductor substrate and on an upper surface of the drift region, and a gate electrode material, wherein one of the gate dielectric materials comprise a high-k dielectric material, and wherein the insulator material of the shallow trench isolation structure is adjacent to a source region and is constrained to cover the drift region and a portion of the semiconductor substrate which is devoid of an implanted region.

2. The structure of claim 1, wherein the drift region comprises an N-well and the gate dielectric materials are directly on an upper surface of the insulator material of the shallow trench isolation structure within the trench.

3. The structure of claim 1, wherein the gate electrode material is partially within the shallow trench isolation structure and over a surface of the drift region and the gate dielectric materials over the semiconductor substrate.

4. The structure of claim 3, wherein the gate electrode material comprises a workfunction metal, and wherein the gate dielectric materials comprise a layer of dielectric material that has a same thickness and a same composition as insulator material of the shallow trench isolation structure, wherein the layer of dielectric material and insulator material run coextensively along the trench of the shallow trench isolation structure.

5. The structure of claim 1, wherein the gate dielectric materials further comprise a low-k dielectric material under the high-k dielectric material and is sidewalls of the shallow trench isolation structure.

6. The structure of claim 1, wherein the gate electrode material comprises a polysilicon material and one of the gate dielectric materials comprises a low-k dielectric material.

7. The structure of claim 1, wherein the gate structure is symmetrically positioned within the shallow trench isolation structure.

8. The structure of claim 1, wherein the gate structure is asymmetrically positioned within the shallow trench isolation structure such that one sidewall of the shallow trench isolation structure is thicker than an opposing sidewall.

9. The structure of claim 1, wherein the gate structure comprises tapered sidewalls.

10. The structure of claim 1, wherein the gate structure comprises sidewalls that are parallel to sidewalls of the shallow trench isolation structure.

11. A structure comprising:
a trench structure extending into a semiconductor substrate;
a shallow trench isolation structure extending into the trench structure, wherein sidewalls of the shallow trench isolation structure is fully contained within the trench structure; and
a gate structure comprising gate dielectric materials and a gate electrode, the gate dielectric materials and the gate electrode being over an upper surface of the semiconductor substrate and fully extending within a trench of the shallow trench isolation structure, wherein the gate dielectric materials comprise a layer of dielectric material that has a same thickness and a same composition as insulator material of the shallow trench isolation structure, wherein the layer of dielectric material and the insulator material run coextensively along the trench of the shallow trench isolation structure.

12. The structure of claim 11, further comprising an N-well within the semiconductor substrate, wherein the shallow trench isolation structure and a portion of the gate structure extend to within the N-well, and wherein the gate dielectric materials and the gate electrode extend over an upper surface of the N-well.

13. The structure of claim 11, wherein the gate electrode comprises a workfunction metal and the gate dielectric materials comprise a low-k dielectric material and a high-k dielectric material, the low-k dielectric material being sidewalls of the shallow trench isolation structure.

14. The structure of claim 11, wherein the gate electrode comprises a polysilicon material and the gate dielectric material comprises a low-k dielectric material.

15. The structure of claim 11, wherein the gate structure is symmetrically positioned within the shallow trench isolation structure, and wherein the gate dielectric material is adjacent to a source region and is constrained to over the drift region and a portion of the semiconductor substrate which is devoid of an implant.

16. The structure of claim 11, wherein the gate structure is asymmetrically positioned within the shallow trench isolation structure.

17. The structure of claim 11, wherein the gate structure comprises tapered sidewalls.

18. The structure of claim 11, wherein the gate structure comprises sidewalls that are parallel to sidewalls of the shallow trench isolation structure.

19. A method comprising:
forming a trench structure extending into a semiconductor substrate;
forming a shallow trench isolation structure extending into the trench structure, wherein sidewalls of the shallow trench isolation structure is fully contained within the trench structure; and
forming a gate structure comprising gate dielectric materials and a gate electrode, the gate dielectric materials and the gate electrode being over an upper surface of the semiconductor substrate and fully extending within a trench of the shallow trench isolation structure, wherein the gate dielectric materials comprise a layer of dielectric material that has a same thickness and a same composition as insulator material of the shallow trench isolation structure, wherein the layer of dielectric material and the insulator material run coextensively along the trench of the shallow trench isolation structure.

* * * * *